(12) United States Patent
Sehgal et al.

(10) Patent No.: US 10,248,499 B2
(45) Date of Patent: Apr. 2, 2019

(54) NON-VOLATILE STORAGE SYSTEM USING TWO PASS PROGRAMMING WITH BIT ERROR CONTROL

(71) Applicant: SANDISK TECHNOLOGIES LLC, Plano, TX (US)

(72) Inventors: Rohit Sehgal, San Jose, CA (US); Nian Niles Yang, Mountain View, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 132 days.

(21) Appl. No.: 15/192,901

(22) Filed: Jun. 24, 2016

(65) Prior Publication Data

US 2017/0371744 A1    Dec. 28, 2017

(51) Int. Cl.
| | |
|---|---|
| *G06F 11/10* | (2006.01) |
| *G11C 16/04* | (2006.01) |
| *G11C 16/10* | (2006.01) |
| *G11C 16/26* | (2006.01) |
| *G11C 29/42* | (2006.01) |
| *G11C 29/44* | (2006.01) |
| *G11C 29/52* | (2006.01) |
| *G11C 29/00* | (2006.01) |

(52) U.S. Cl.
CPC ...... *G06F 11/1068* (2013.01); *G11C 16/0483* (2013.01); *G11C 16/10* (2013.01); *G11C 16/26* (2013.01); *G11C 29/42* (2013.01); *G11C 29/44* (2013.01); *G11C 29/52* (2013.01)

(58) Field of Classification Search
CPC ......... G06F 12/0868; G06F 2212/1016; G06F 2212/281; G06F 2212/313
See application file for complete search history.

(56) References Cited

U.S. PATENT DOCUMENTS

| | | |
|---|---|---|
| 5,764,572 A | 6/1998 | Hammick |
| 5,867,429 A | 2/1999 | Chen |
| 6,046,935 A | 4/2000 | Takeuchi |
| 6,222,762 B1 | 4/2001 | Guterman |
| 6,243,290 B1 | 6/2001 | Kurata |
| 6,522,580 B2 | 2/2003 | Chen |
| 6,535,423 B2 | 3/2003 | Trivedi |
| 6,542,407 B1 | 4/2003 | Chen |
| 6,643,188 B2 | 11/2003 | Tanaka |
| 6,654,287 B2 | 11/2003 | Visconti |
| 6,657,891 B1 | 12/2003 | Shibata |

(Continued)

*Primary Examiner* — Guy J Lamarre
(74) *Attorney, Agent, or Firm* — Vierra Magen Marcus LLP

(57) ABSTRACT

A first phase of a programming process is performed to program data into a set of non-volatile memory cells using a set of verify references and allowing for a first number of programming errors. After completing the first phase of programming, an acknowledgement is provided to the host that the programming was successful. The memory system reads the data from the set of non-volatile memory cells and uses an error correction process to identify and correct error bits in the data read. When the memory system is idle and after the acknowledgement is provided to the host, the memory system performs a second phase of the programming process to program the corrected error bits into the set of the non-volatile memory cells using the same set of verify references and allowing for a second number of programming errors.

20 Claims, 13 Drawing Sheets

(56) References Cited

U.S. PATENT DOCUMENTS

| | | |
|---|---|---|
| 6,717,847 B2 | 4/2004 | Chen |
| 6,771,536 B2 | 8/2004 | Li |
| 6,781,877 B2 | 8/2004 | Cernea |
| 6,807,095 B2 | 10/2004 | Chen |
| 6,888,758 B1 | 5/2005 | Hemink |
| 7,092,290 B2 | 8/2006 | Hemink |
| 7,139,198 B2 | 11/2006 | Guterman |
| 7,177,200 B2 | 2/2007 | Ronen |
| 7,196,928 B2 | 3/2007 | Chen |
| 7,619,930 B2 | 11/2009 | Mokhlesi |
| 7,900,102 B2 | 3/2011 | Sokolov |
| 2004/0057283 A1 | 3/2004 | Cernea |
| 2004/0109357 A1 | 6/2004 | Cernea |
| 2006/0221692 A1 | 10/2006 | Chen |
| 2008/0084748 A1* | 4/2008 | Hemink ............... G11C 11/5628 365/185.18 |
| 2008/0279005 A1* | 11/2008 | France ................ G06F 12/0246 365/185.11 |
| 2009/0259896 A1* | 10/2009 | Hsu .................... G06F 11/1068 714/723 |
| 2012/0131400 A1* | 5/2012 | Rey-Losada ........... G11C 17/16 714/724 |
| 2012/0314500 A1* | 12/2012 | Song ................. G11C 16/3459 365/185.12 |
| 2013/0055046 A1* | 2/2013 | Blodgett .............. G06F 11/106 714/764 |
| 2013/0311853 A1* | 11/2013 | Bueb .................. G06F 11/1048 714/766 |

\* cited by examiner

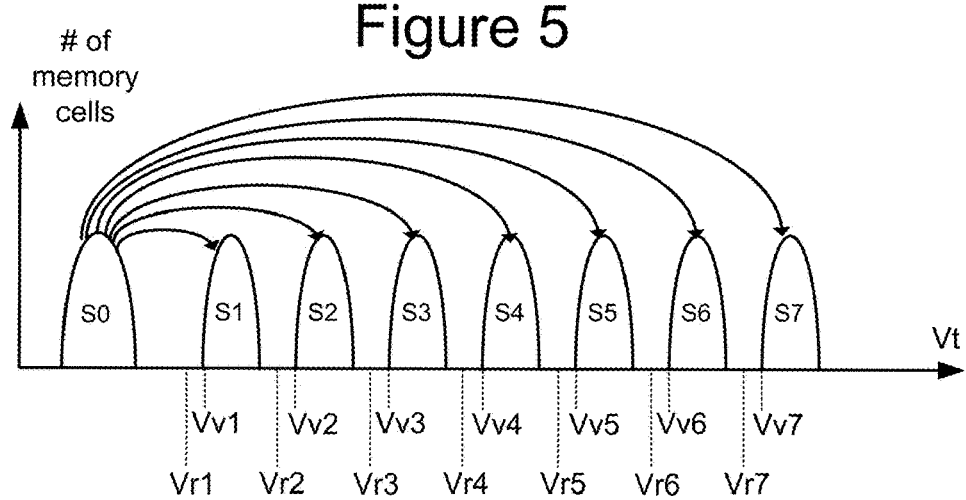
Figure 5
Figure 5A
| S0 | S1 | S2 | S3 | S4 | S5 | S6 | S7 |
|----|----|----|----|----|----|----|----|
| 1  | 1  | 1  | 0  | 0  | 0  | 0  | 1  |
| 1  | 1  | 0  | 0  | 1  | 1  | 0  | 0  |
| 1  | 0  | 0  | 0  | 0  | 1  | 1  | 1  |
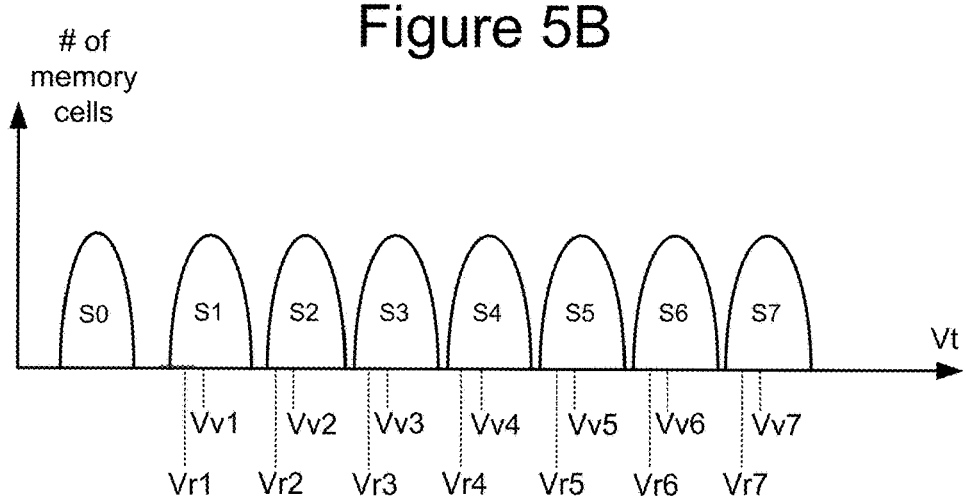
Figure 5B

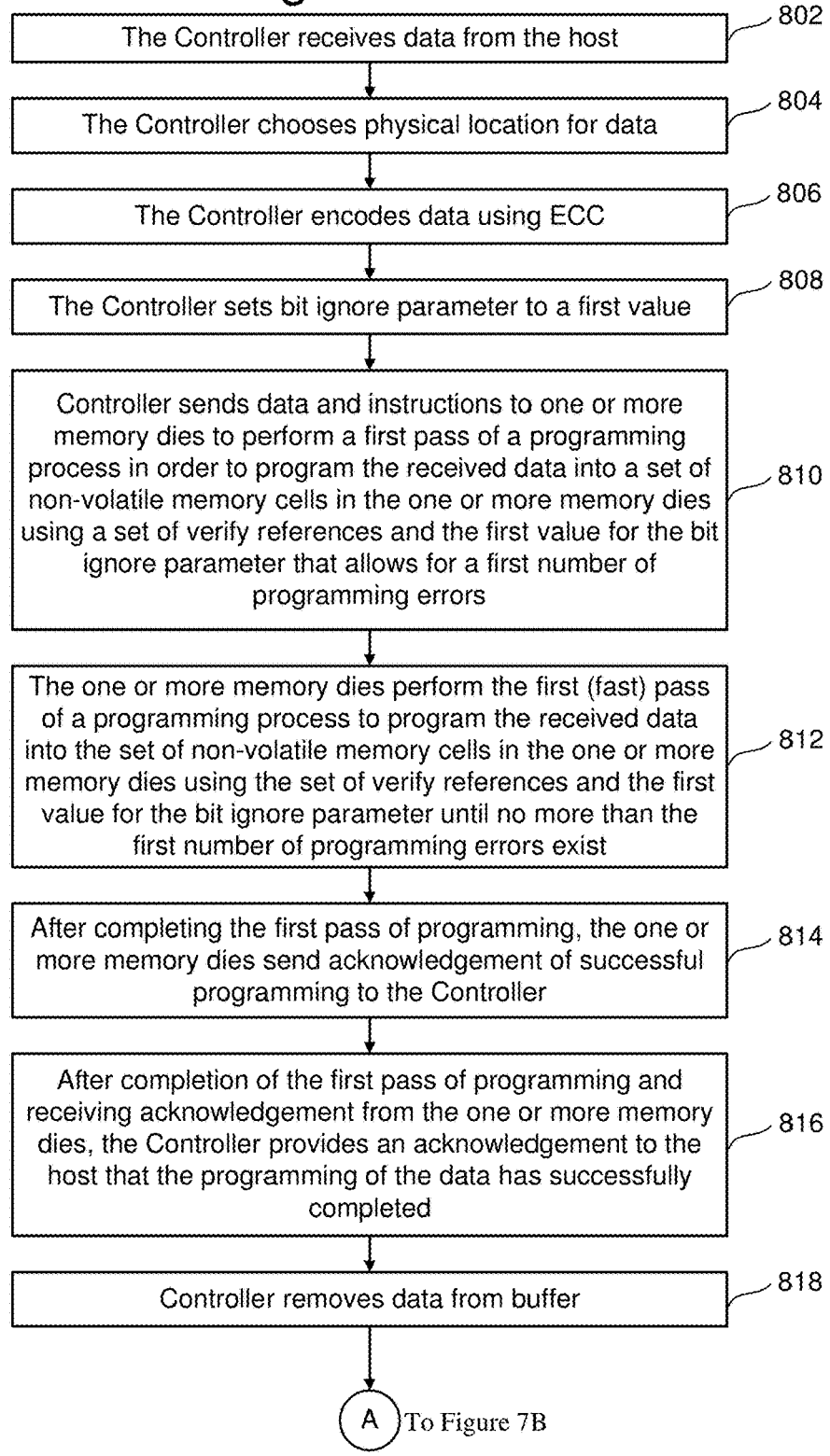

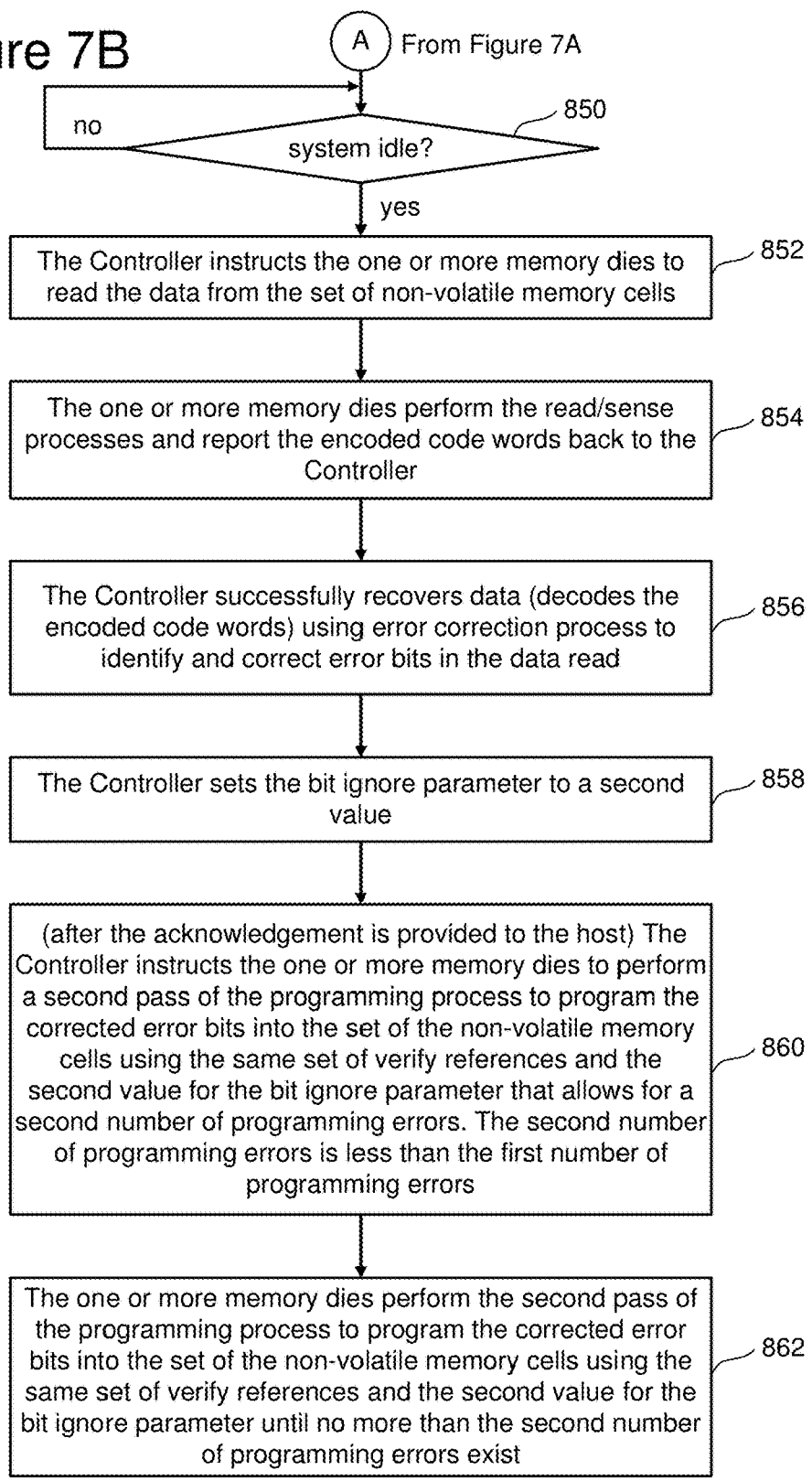

NON-VOLATILE STORAGE SYSTEM USING TWO PASS PROGRAMMING WITH BIT ERROR CONTROL

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

When a memory system is deployed in an electronic device, the memory system can be used to program data, read data and/or erase data. As with most electronic devices, performance is important to users. For many memory systems, programming performance of the memory system [e.g., a solid state drive ("SSD")] is limited by the programming speed of the memory die, and the programming speed of the memory die is further limited by the amount of slow-to-program memory cells on the memory die.

BRIEF DESCRIPTION OF THE DRAWINGS

Like-numbered elements refer to common components in the different figures.

FIG. 5 depicts threshold voltage distributions.

FIG. 5A is a table describing one example of an assignment of data values to data states.

FIG. 5B depicts threshold voltage distributions.

FIGS. 7A and 7B together depict a flow chart describing one embodiment of a process for programming data in two passes.

DETAILED DESCRIPTION

To increase the performance of programming data, a non-volatile storage system will program the data in two passes. In the first pass, memory cells are programmed more quickly than normal to an interim condition/state that is reflective of the data such that the data can be successfully read using an error correction process. The first pass completes faster than a full programming process; however, the data is not sufficiently programmed to withstand data retention issues, but the number of errors is within the capabilities of the Error Correction Code (ECC) engine. After completing the first pass, the host is advised that the programming process has completed successfully. Thus, the programming process appears to be faster from the point of view of the host. As such, the host can operate faster; for example, a digital camera can take more photos. Later, in the background while the memory system is idle, the second pass of the programming process is performed. The memory cells are read, erroneous bits are corrected by the ECC engine and the memory cells are subjected to additional programming for the corrected erroneous bits. The second pass has the effect of tightening the threshold voltage distributions of the programmed memory cells to withstand data retention issues.

In one example embodiment, a non-volatile memory system receives data from a host to be programmed A first phase of a programming process is performed to program the received data into a set of the non-volatile memory cells using a set of verify references and a first bit ignore parameter that allows for a first number of programming errors. After completing the first phase of programming, an acknowledgement is provided to the host that the programming of the data has successfully completed. The memory system reads the data from the set of non-volatile memory cells and uses an error correction process to identify and correct error bits in the data read. When the memory system is idle (e.g., as a background process) and after the acknowledgement is provided to the host, the memory system performs a second phase of the programming process to program the corrected error bits into the set of the non-volatile memory cells using the same set of verify references and a second bit ignore parameter that allows for a second number of programming errors. The second number of programming errors is less than the first number of programming errors.

Figure 1:
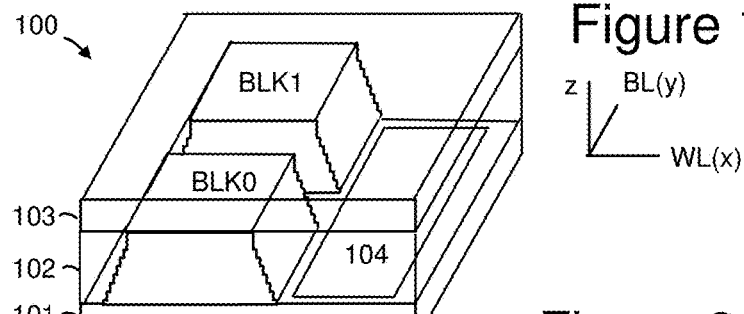
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
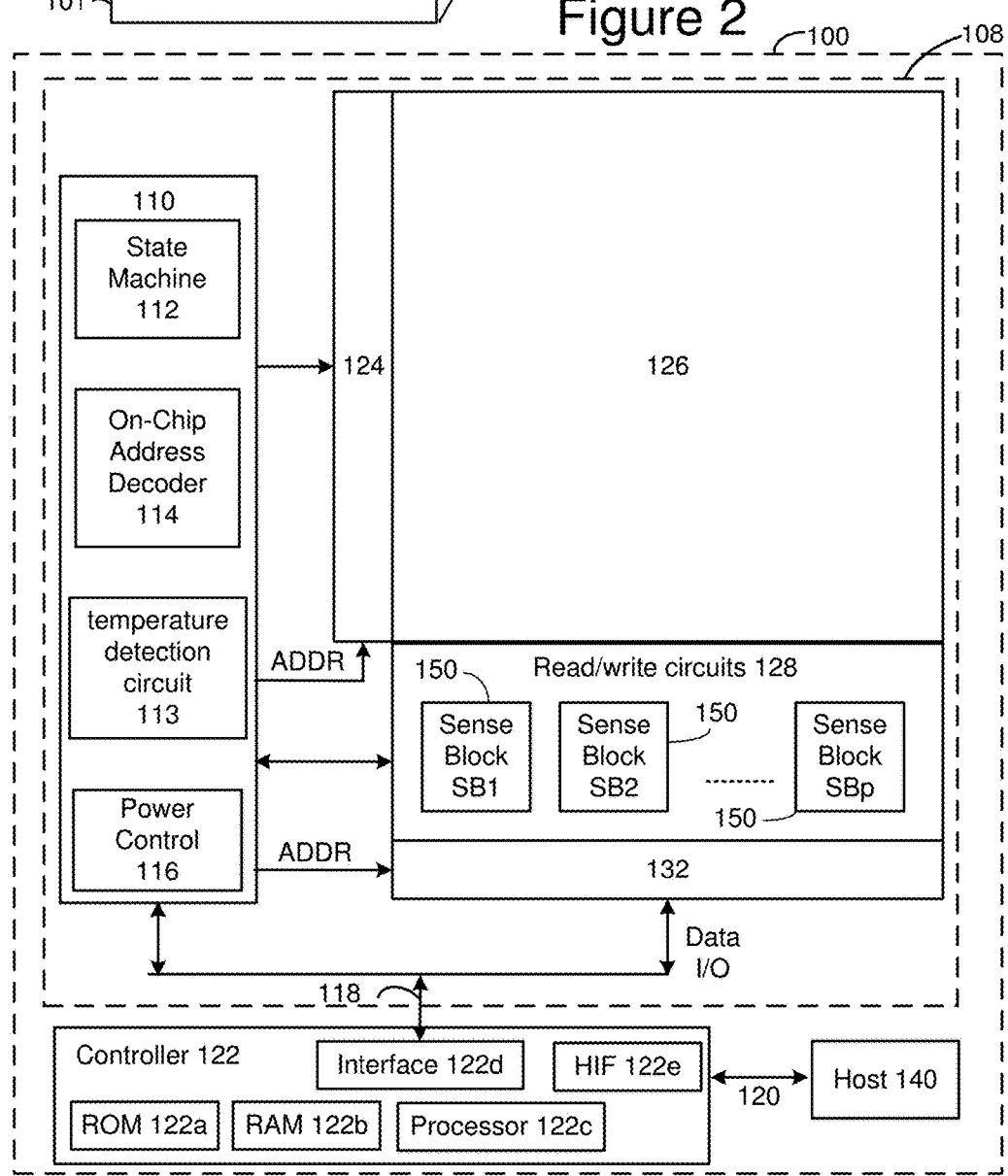
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise one or more processors 122c, ROM 122a, RAM 122b, Memory Interface 122d and Host Interface 122e, all of which are interconnected. One or more processors 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
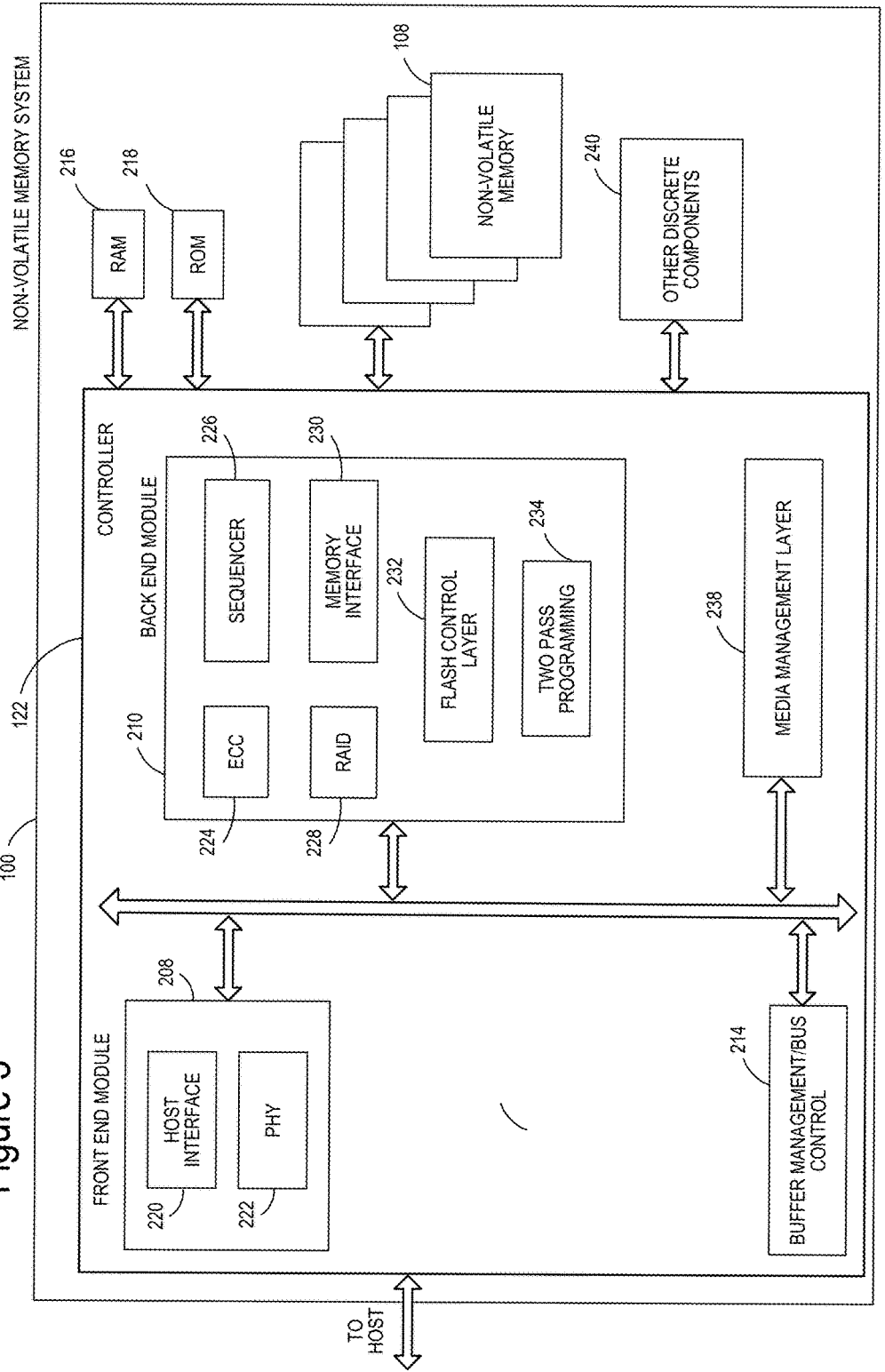
FIG. 3 is a block diagram depicting one embodiment of a Controller.

FIG. 3 is a block diagram of example memory system 100, depicting more details of Controller 122. In one embodiment, the system of FIG. 3 is a solid state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more porcessors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Back end module 210 also includes two pass programming module 234. In one embodiment, two pass programming module 234 (specific hardware, software/firmware, or a combination of specific hardware and software/firmware) performs the proposed two pass programming described herein. In one example implementation, two pass programming module 234 programs data received from a host into a set of the non-volatile memory cells in the memory dies 108 using a set of verify references and a first bit ignore parameter, oversees/causes the reading of the data from the set of non-volatile memory cells by the memory dies 108 (see the one or more control circuits) and identifies error bits in the data read using ECC engine 224, and programs the error bits into the set of the non-volatile memory cells using the same set of verify references and a second bit ignore parameter while the non-volatile storage system is idle (with the second bit ignore parameter being lower than the first bit ignore parameter). More details about the functions of two pass programming module 234 is provided below with respect to FIGS. 7A and 7B.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In in one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

In one embodiment, as discussed below with respect to FIGS. 7-12B, Controller 122 determines candidate bad blocks to test for usability based on previously recorded error codes, causes testing of the candidate bad blocks for usability, and causes storage of information in candidate blocks determined to be still usable.

Figure 4:
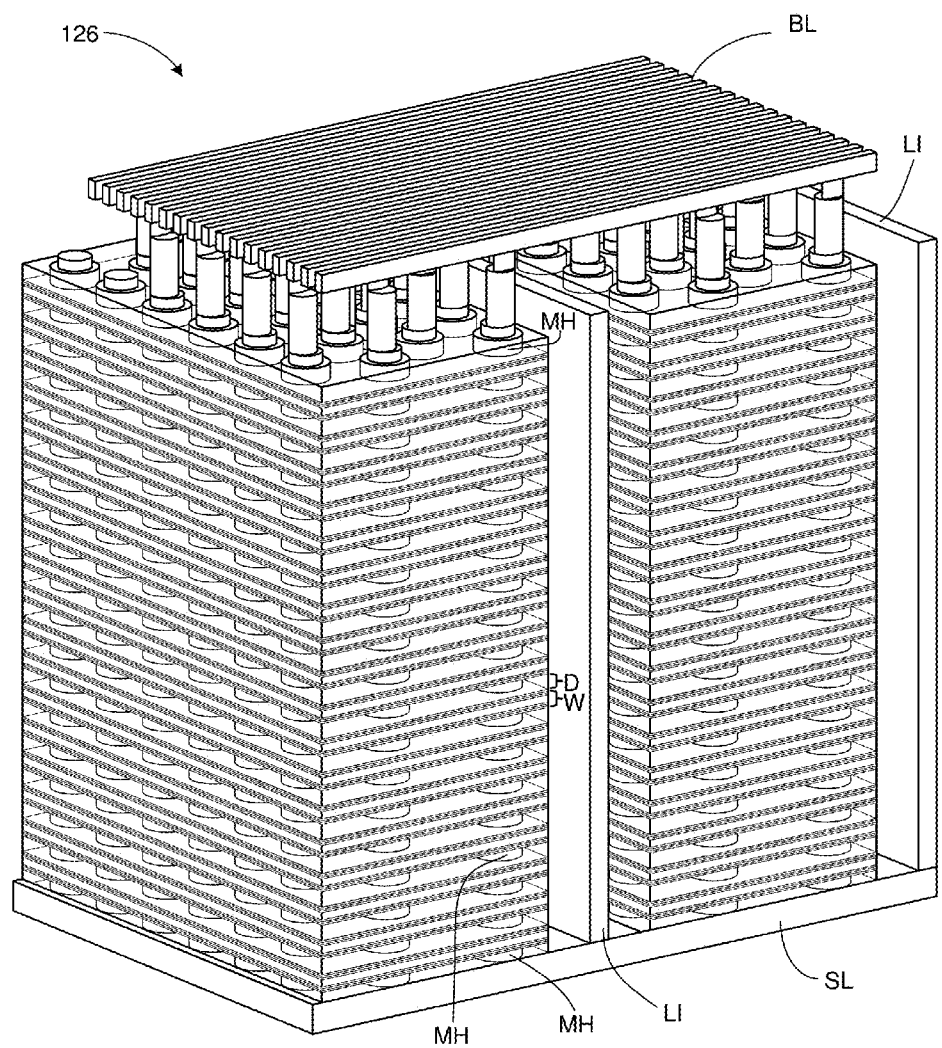
FIG. 4 is a perspective view of a portion of one embodiment of a three dimensional monolithic memory structure.

FIG. 4 is a perspective view of a portion of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

Figure 4A:
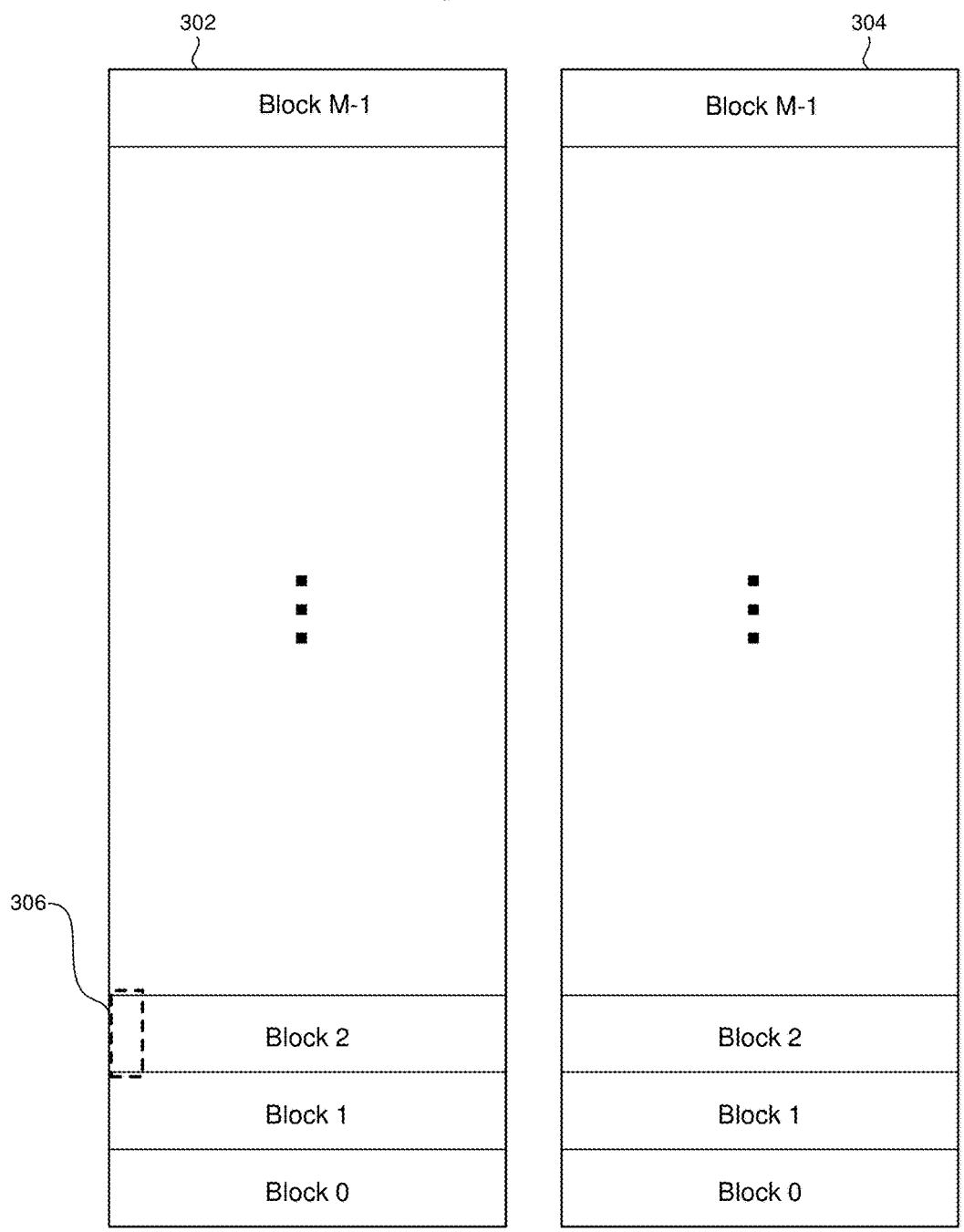
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
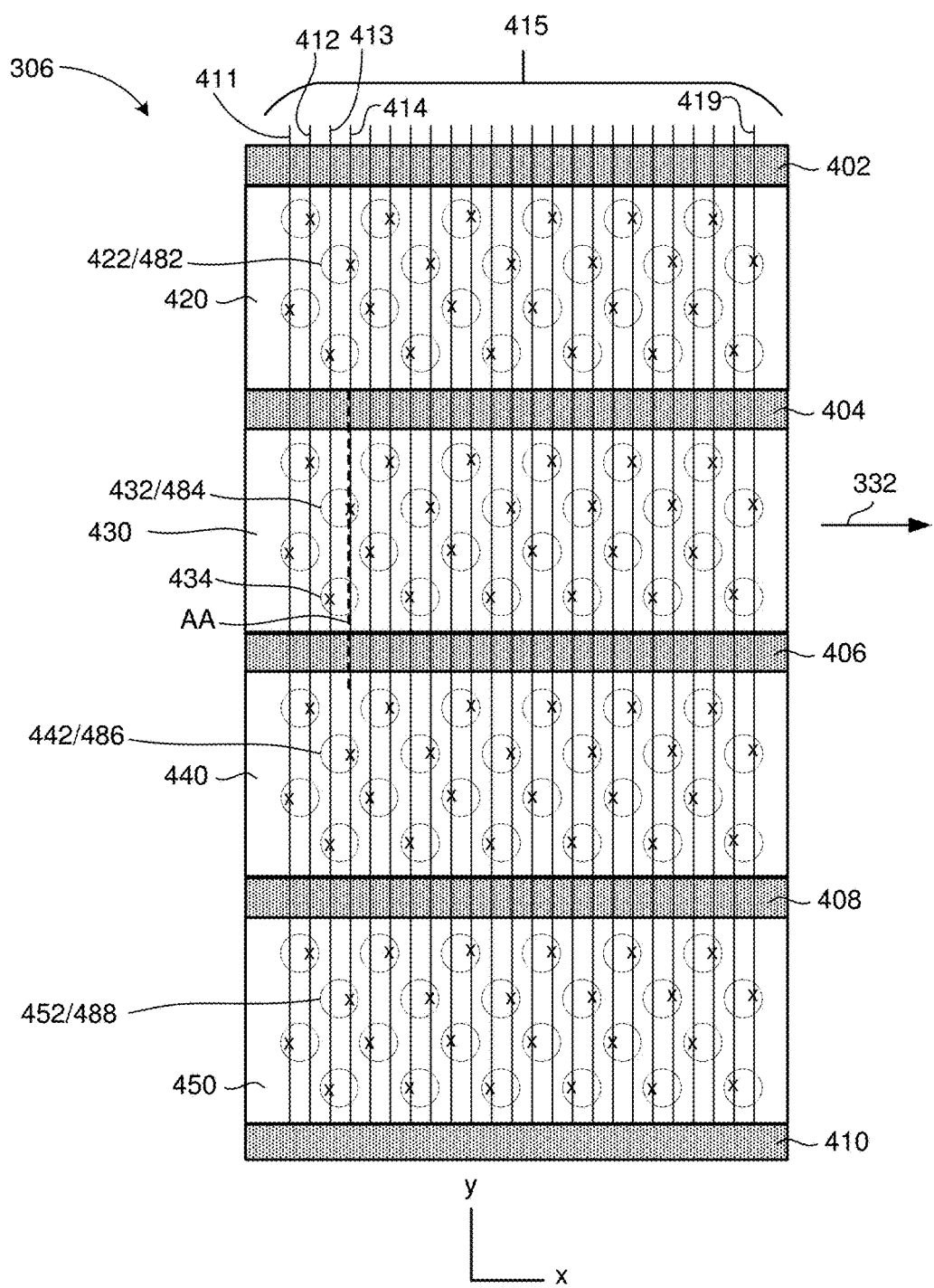
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, ... 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
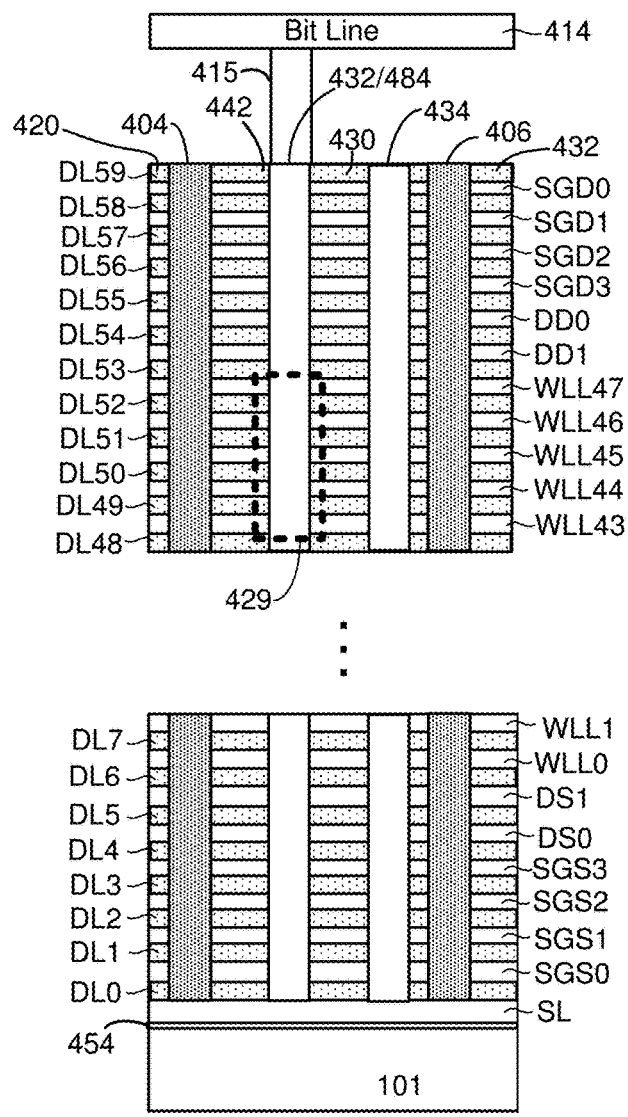
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
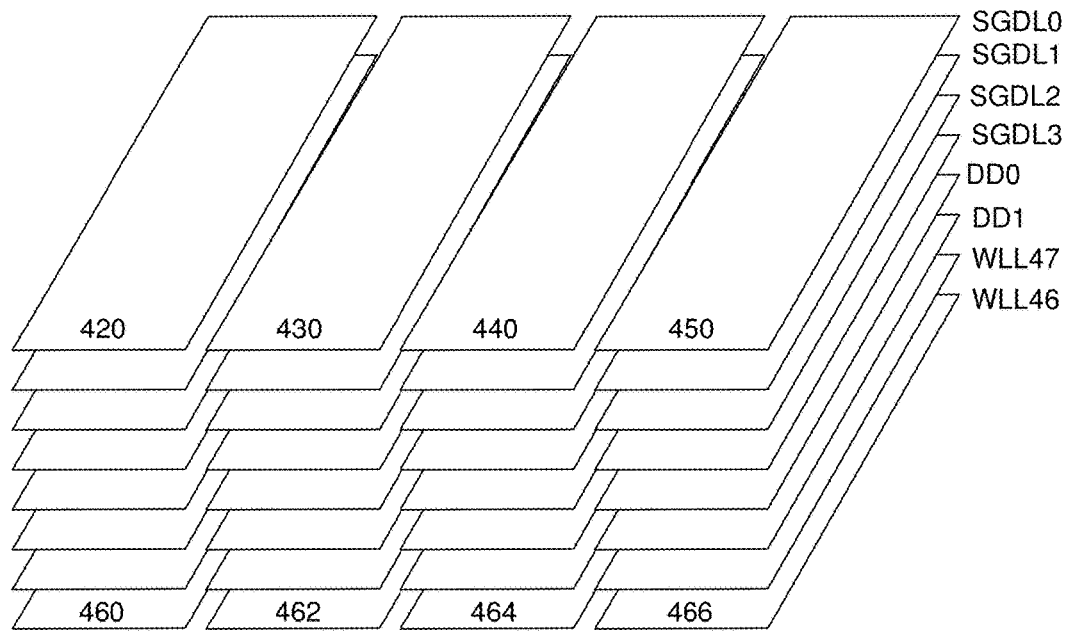
FIG. 4D depicts a view of the select gate layers and word line layers.
Figure 4D:
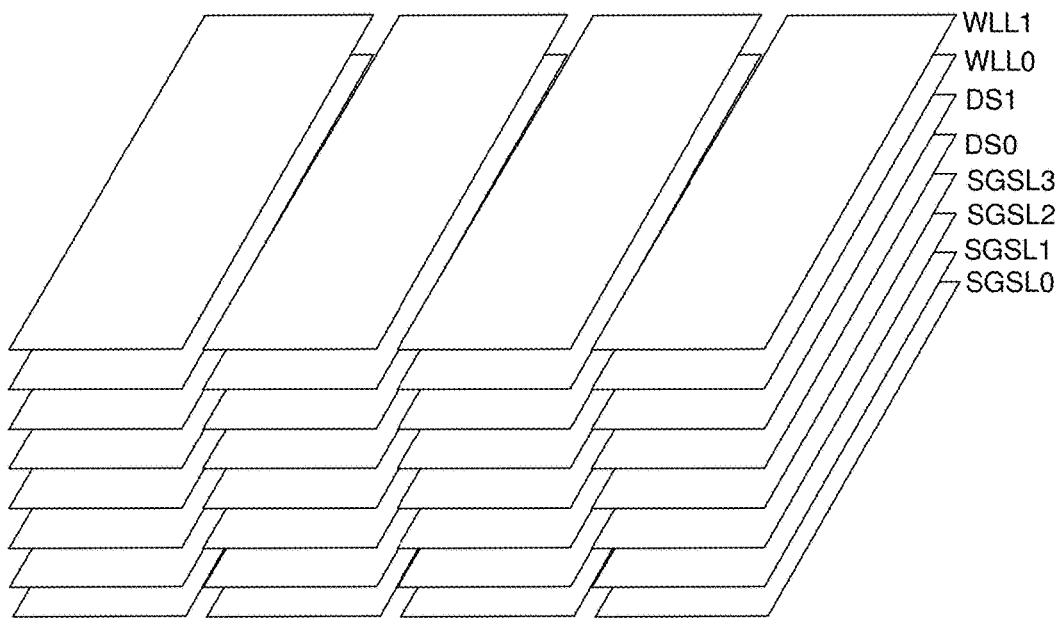

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
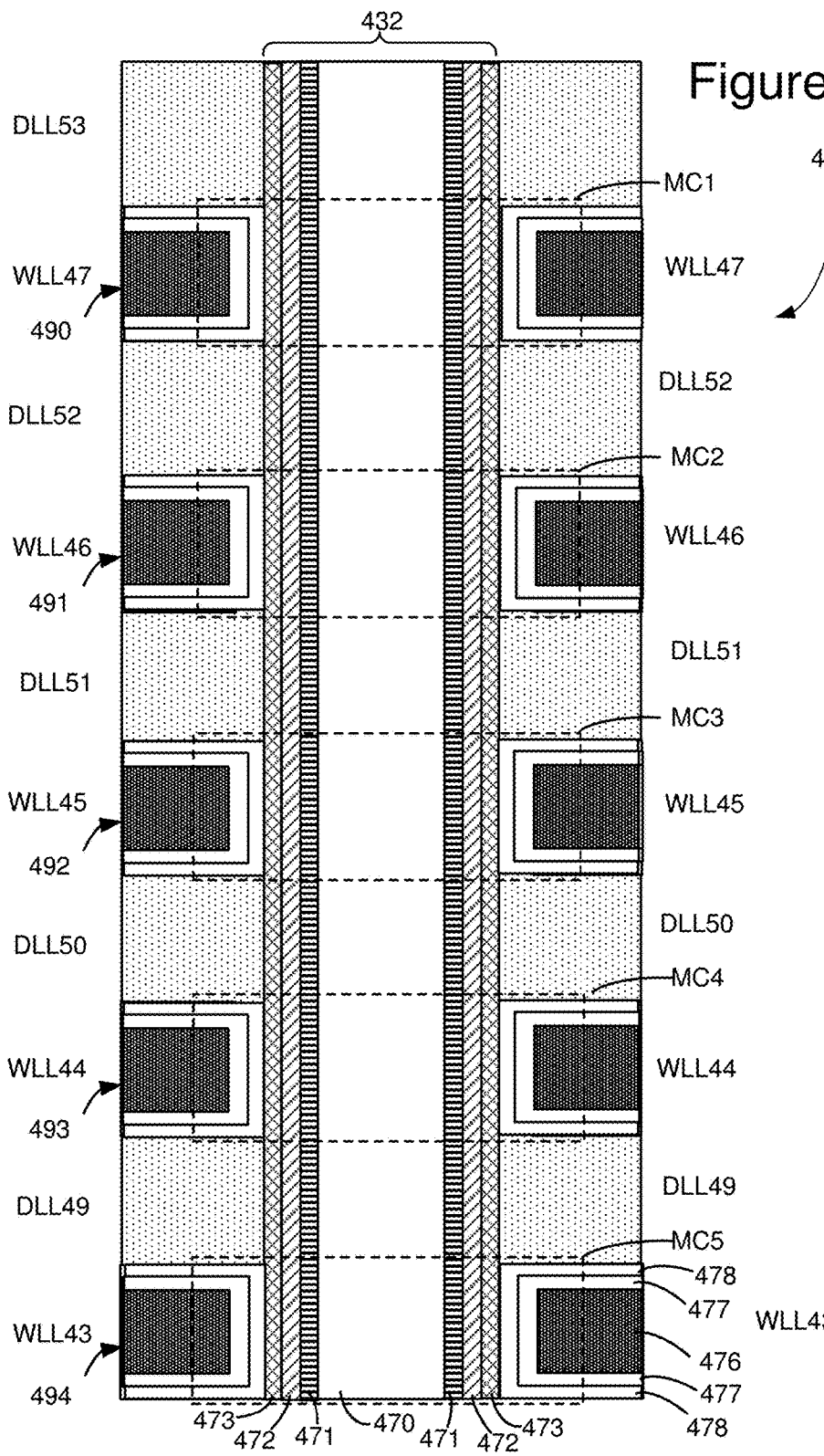
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
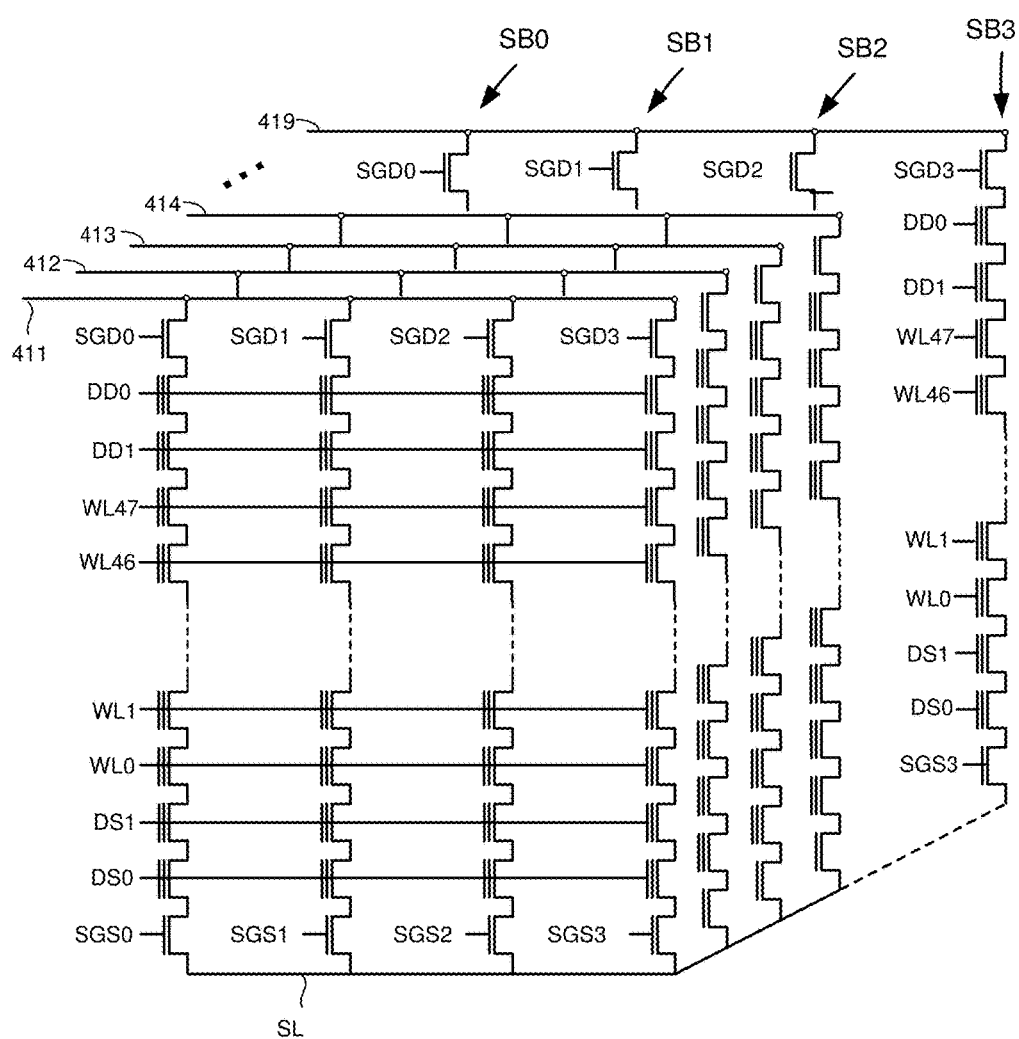
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, andVr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 5A is a table describing one example of an assignment of data values to data states. In the table of FIG. 5A, S0-111. S1=110, S2=200, S3=000, S4=010, S5=011, S6=001 and S7=101. Other encodings of data can also be used. No particular data encoding is required by the technology disclosed herein.

Figure 6A:
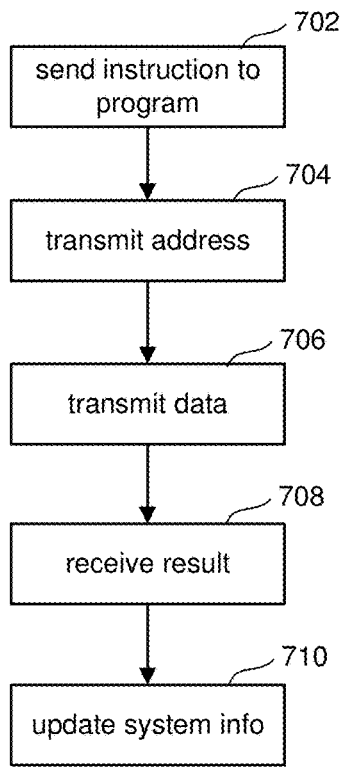
FIG. 6A is a flow chart describing one embodiment of a process for programming.

FIG. 6A is a flowchart describing one embodiment of a process for programming that is performed by Controller 122. In some embodiments, rather than have a dedicated Controller, the host can perform the functions of the Controller. In other embodiments, the state machine 112 can perform the functions of the Controller. In step 702, Controller 122 sends instructions to one or more memory die 108 to program data. In step 704, Controller 122 sends one or more logical addresses to one or more memory die 108. The one or more logical addresses indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, Controller 122 would receive host data and an instruction to program from the host, and the Controller would run the ECC engine to create code words from the host data. These code words are the data transmitted in step 706. Controller can also scramble the data to achieve wear leveling with respect to the memory cells.

Figure 6B:
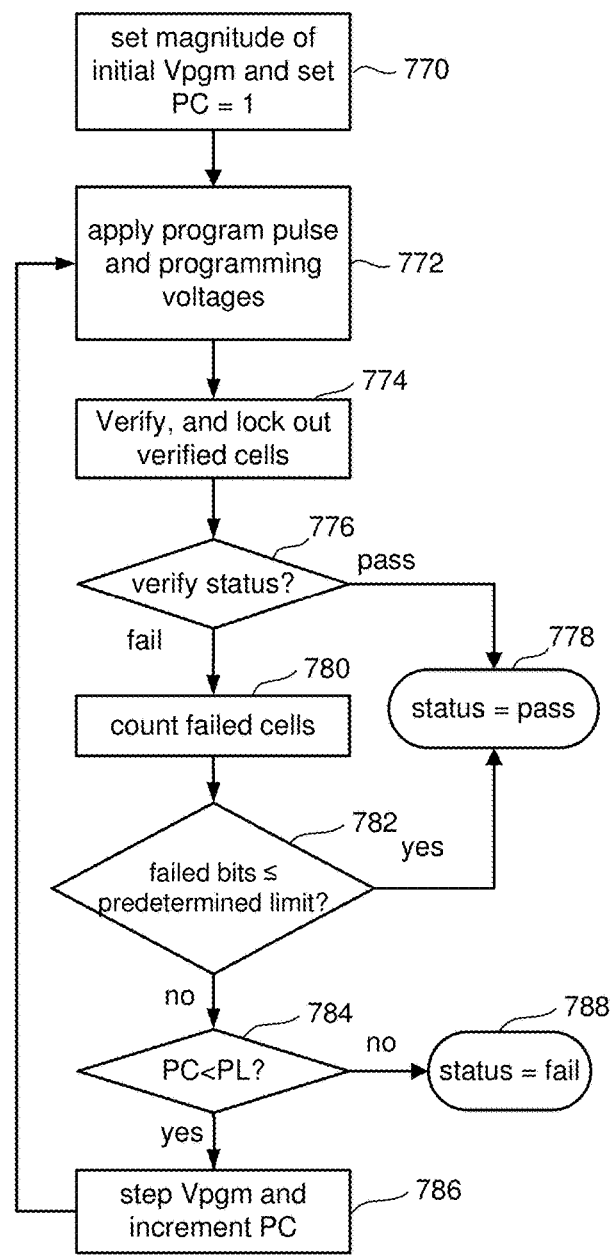
FIG. 6B is a flow chart describing one embodiment of a process for programming.

FIG. 6B is a flowchart describing one embodiment of a process for programming. The process of FIG. 6B is performed by the memory die in response to the steps of FIG. 6A (ie in response to the instructions, data and addresses from Controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line so that another iteration (steps 772-786) of the programming process of FIG. 6B is performed.

In one embodiment, data is programmed in units of pages. So, for example, the process of FIG. 6B is used to program one page of data. In one embodiments, one page of data includes all of the data bits of all of the memory cells in one sub-block connected to a common word line. In another embodiment, one page of data includes all of the data bits of all of the memory cells connected to a common word line. In another embodiment, each word line can store multiple pages within a sub-block. In another embodiment, each of multiple bits stored in a memory cell are in a different page. Other arrangements of pages can also be used.

Because it is possible that errors can occur when programming or reading, and errors can occur while storing data (e.g., due to electrons drifting, data retention issues or other phenomenon), error correction is used with the programming of a page of data. Memory systems often use Error Correction Codes (ECC) to protect data form corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller 122 receives host data, also referred to as information bits, that is to be stored non-volatile three dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in the non-volatile storage 126 by programming one or more memory cells to one or more programming states, which corresponds to v.

In one possible implementation, an iterative probabilistic decoding process is used when reading data which implements error correction decoding corresponding to the encoding implemented in the Controller 122 (see ECC engine 224). Further details regarding iterative probabilistic decoding can be found in the above-mentioned D. MacKay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 122 receives the code word Y1 and accesses the LLRs and iterates in successive iterations in which it determines if parity checks of the error encoding process have been satisfied. If all parity checks have been satisfied, the decoding process has converged and the code word has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

For many memory systems, programming performance of the memory system is limited by the programming speed of the memory die, and the programming speed of the memory die is further limited by the amount of slow-to-program memory cells on the memory die. To increase the performance of programming data, a non-volatile storage system will program the data in two passes. In the first pass, memory cells are programmed more quickly than normal to an interim condition/state that is reflective of the data such that the data can still be successfully read using an error correction process. The first pass completes faster than a full programming process; however, the data is not sufficiently programmed to withstand data retention issues, but the number of errors is within the capabilities of the Error Correction Code (ECC) engine. After completing the first pass, the host is advised that the programming process has completed successfully. Thus, the programming process appears to be faster from the point of view of the host. As such, the host can operate faster; for example, a digital camera can take more photos. Later, in the background while the memory system is idle, the second pass of the programming process is performed. The memory cells are read, erroneous bits are corrected by the ECC engine and the memory cells are subjected to additional programming for the corrected erroneous bits. The second pass has the effect of tightening the threshold voltage distributions of the programmed memory cells to withstand data retention issues.

FIGS. 7A and 7B together depict a flow chart describing one embodiment of a process for programming data in two passes. The process of FIGS. 7A and 7B is performed by the one or more control circuits discussed above. In one embodiment, parts of the process of FIGS. 7A and 7B is performed at the direction of Controller 122 and parts of the process of FIGS. 7A and 7B is performed at the direction of state machine 112 (and performed by the components of FIG. 2), as described below. However, in other embodiments, the entire process of FIGS. 7A and 7B can be performed on the memory die 108 (such as at the direction of state machine 112 in conjunction with other the control circuits of FIG. 2, or by another circuit/device/one or more processors on memory die 108), or can be performed by another one or more processors off the memory die. In some systems, the host can perform the functions described below for the Controller.

In step 802, Controller 122 receives data from Host 140. In step 804, Controller 122 chooses a physical location in the one or more memory dies 108 to store the received data. In one example embodiment, the memory system is an SSD that includes Controller 122 connected to 32-64 multiple memory dies 108. In step 806, Controller 122 encode the data received from the Host using error correction codes (using ECC engine 224). The result of encoding the data is a set of code words that will be stored in the one or more memory dies 108 in the locations chosen in step 804. In step 808, Controller 122 sets the bit ignore parameter in each of the one or more memory dies to a first value. As discussed above with respect to FIG. 6B, the programming process will stop when the number of failed bits is below a predetermined limit (see step 782 for FIG. 6B). In one embodiment, that predetermined limit from step 782 for FIG. 6B is the bit ignore parameter, which indicates the number of errors allowed in a successful programming process. In one embodiment, Controller 122 sets the bit ignore parameter to the first value by sending instruction to each of the one or more memory dies 108 to set the bit ignore parameter. This can include storing a data value in a register, sending the instruction to the memory dies, storing a data value in a memory location, or other means for setting the bit ignore parameter. In one embodiment, during a traditional prior art programming process, the bit ignore parameter is set at 0.023% (or a similar number) of the total number of bits being programmed. However, the proposed technology includes a first pass being a faster programming process than the traditional prior art programming process; therefore, the first pass of the proposed programming process will utilize a relaxed bit ignore parameter. In one embodiment, step 808 includes Controller 122 setting the bit ignore parameter to a number much higher than normally used for the bit ignore parameter. One example of a first value for the bit ignore parameter is 0.6% of the total number of bits being programmed.

In step 810, Controller 122 sends data and instructions to one or more memory dies to perform a first pass of the programming process in order to program the received data into the set of non-volatile memory cells in the one or more memory dies 108 using the standard set of verify references and the first value for the bit ignore parameter that allows for a first number of programming errors. In one embodiment, step 810 is performed using the process of FIG. 6A. The standard set of verified references referred to in step 810 correspond to the verified reference voltages depicted in FIG. 5 (e.g., Vv1, Vv2, Vv3, Vv4, Vv5, Vv6, and Vv7). In step 812, the one or more memory dies 108 perform the first pass (which is faster than the typical prior art programming process) to program the received data into the set of non-volatile memory cells in the one or more memory dies 108 using the standard set of verify references and the first value for the bit ignore parameter that allows for no more than the first number of programming errors to exist in a successful programming process. In one example embodiment, step 812 is performed by utilizing the process of FIG. 6B. The result of step 812 is that the targeted memory cells in the one or more memory dies 108 are programmed to a condition that is close to but not quite the same as the final targeted data states. An example of the final targeted data states are S0-S7 depicted in FIG. 5. FIG. 5B shows the threshold voltage distributions after the first pass programming operation using full sequence programming (e.g., after step 812 of FIG. 7A). As can be seen, the threshold voltage distributions for S0-S7 in FIG. 5B are wider than in FIG. 5, and the lower bound of the threshold voltage distributions can be lower than the read reference voltages, which can cause some errors. As long as the number of errors is less than the capability of the ECC engine, the system can recover the data. The threshold voltage distributions for S0-S7 of FIG. 5B are close to but not quite the same as the final targeted data states S0-S7 of FIG. 5. The threshold voltage distributions for S0-S7 of FIG. 5B are representative of the final targeted data states; however, the threshold voltage distributions are likely to be slightly off and wider.

In step 814 of FIG. 7A, after completing the first pass of the programming, the one or more memory dies 108 send an acknowledgment of successful programming to the Controller. In one embodiment, the one or more memory dies will send a message to Controller indicating that programming has completed successfully. In another embodiment, the one or more memory dies 108 can have an internal register which when populated with a predetermined value indicates successful programming, and this register (or latch) can be polled or otherwise read by Controller 122. In another embodiment, the one or more memory dies 108 can have an output pin that can indicate successful programming, and this output pin (or other output structure) can be polled or otherwise read by Controller 122. Other forms of acknowledgment can also be used. In step 816, after completing the first pass of programming and receiving the acknowledgment from the one or more memory dies 108, Controller 122 provides an acknowledgment to Host 140 that the programming of the data has successfully completed. Examples of providing acknowledgment to Host 140 include any one of sending a message to Host 140 that programming has completed successfully, indicating to the Host 140 that a different memory operation is being performed (which implies the original programming completed successfully), indicating to Host 140 that the memory system is available for another operation, or setting a register/memory location/output pin to indicate successful programming In step 818, Controller 122 will remove the data being programmed from its buffer. That is, when Controller 122 receives data from Host 140 in step 802, that data was stored in a buffer for the duration of the programming process. That buffer can reside in RAM 216 (FIG. 3) or RAM 122B (FIG. 2). After successfully completing the first pass, the data can be removed from the buffer. Thus, the data being programmed will not be in the buffer during the second pass of the programming process, which allows Controller 122 to use the portion of RAM 216 for another purpose.

The process of FIG. 7A continues at step 850 of FIG. 7B, when the Controller determines whether the memory system is idle (e.g., if the memory system is not performing any programming, reading or erase operations in response to a request from the Host). In other embodiments, the system is idle if it is performing below its total capacity for performing memory operations. If Controller 122 determines that the system is not idle, then Controller 122 will wait until the system is idle (step 850). Once Controller 122 determines that the system is idle (step 850), then Controller 122 will initiate the second pass of the programming process starting at step 852.

In step 852, Controller 122 instructs the one or memory dies 108 to read the data from the set of non-volatile memory cells. In step 854, the one or more memory dies 108 perform the reading/sensing processes in order to read the data from the set of one or more non-volatile memory cells. The one or more memory dies 108 report the read/sensed encoded code words to the Controller 122. That is, the encoded data (see step 806) that was programmed in step 812 is read in step 854 and provided back to Controller 122. In step 856, Controller 122 uses ECC engine 224 to perform the error correction process in order to decode the encoded code words, thereby, recovering the data. The error correction process for decoding the encoded code words will identify error bits and correct those error bits in the data read from the one or more memory dies 108. As depicted in FIG. 7B, steps 852-856 are performed when the system is idle (e.g., and/or performed in the background). In other embodiments, steps 852-856 do not have to be performed only when the system is idle. Rather, steps 852-856 can be performed when the system is not idle. However, steps 858-860, discussed below, are performed when the system is idle.

In step 858 of FIG. 7B, Controller 122 sets the bit ignore parameter for the one or more memory dies 108 to a second value. One example of the second value is 0.023% of the bits programmed Thus, the second value is a much smaller number than the first value, thereby allowing for much less programming errors in the second pass as compared to the first pass. In one embodiment, the bit ignore parameter is stored on each of the one or more memory dies 108. In step 860, which is performed after the acknowledgment to the host (see step 816) is provided by Controller 122, Controller 122 will instruct the one or memory dies 108 to perform a second pass of the programming process to program the corrected error bits into the set of non-volatile memory cells using the same set of verify references (e.g., Vv1, Vv2, Vv3, Vv4, Vv5, Vv6, and Vv7) as the first pass and the second value for the bit ignore parameter that allows for a second number of programming errors. The second number of programming errors (e.g., 0.023% of the bits programmed) is less than the first number of programming errors (e.g., 0.6% of the bits programmed).

As discussed above, step 856 includes correcting error bits. The second pass programming in step 860 includes only programming those bits that were corrected in step 856. In another embodiment, all bits that need programming can receive programming in the second pass. In step 862, the one or more memory dies 108 perform the second pass of programming to program the corrected error bits into the set of non-volatile memory cells using the same set of verify references as the first pass and the second value for the bit ignore parameter until no more than the second number of programming errors exists.

In one embodiment, the system will program word lines in a sequential order, such as WL0, WL1, WL2, WL3, . . . . Using the two-pass programming, the system will first perform the first pass for WL0 then perform the second pass for WL0, then perform the first pass for WL1, then perform the second pass for WL1, then perform the first pass for WL2, In such an embodiment, the technology described herein is beneficial for random programming, for example, if only programming one word line. Alternatively, the technology described herein could also be useful when the programming the last word line being programmed In another embodiment, the technology described herein can be useful for programming every word line (or a subset of word lines) when multiple word lines are being programmed. In another embodiment, the system can program using the first pass for multiple word lines followed by then programming the second pass for multiple word lines.

Looking back at FIG. 4F, some embodiments include multiple sub-blocks. Thus memory cells connected to a common word line can be in any one of the four sub-blocks SB0, SB1, SB2, or SB3. In one embodiment, the process of FIG. 7A and FIG. 7B can be performed for an entire word line. In another embodiment, the first pass can first be performed for memory cells of sub block SB0 connected to a common word line WLn, followed by a first pass for memory cells connected to WLn in sub block SB1, followed by the first pass for memory cells connected to WLn for SB2, and followed by memory cells connected to WLn in sub block SB3. After performing the first pass for all four sub-blocks and the common word line WLn, then the second pass can be performed for memory cells connected to WLn that are in SB0, followed by the second programming pass for memory cells connected to WLn that are in SB1, followed by the second programming pass for memory cells connected to WLn that are in SB2, followed by the second programming pass for memory cells connected to WLn that are in SB3. Subsequently, the process can be repeated for other word lines. Thus, the first pass is performed for all four sub-blocks for a given word line followed by the second pass for all four sub-blocks for a given word line, followed by all four sub-blocks undergoing the first pass for another word line, followed by all four blocks of the another word line receiving the second pass, and so on. In these embodiments, steps 810 and 812 include the one or more control circuits being configured to perform the programming of data in the first pass until no more than the first number of programming errors exists by programming the data to a set of non-volatile memory cells in different sub-blocks connected to a common word line. When performing the reading of steps 852-856 using the embodiment of FIG. 4F, each sub-block is read out separately and decoded separately.

In one embodiment, the number used for the bit ignore parameter during either the first pass or the second pass should not exceed the correction capabilities of the ECC engine; therefore, the programming operation of the first pass should reach a stage where the word line is readable and the ECC engine can fix the errors.

In one embodiment, the energy required for the first pass is less than what is normally required for programming Before doing the second pass, a read operation is performed to check if the second pass program operation is needed at all. If not, then the system saves power for the second pass programming operation. Even if a second pass programming operation is required, since the system already knows about the erroneous bits, the programming is performed much faster because less bits are programmed and less programming will be required. Additionally, the power required for the ECC engine to compute and correct the erroneous bits is very minimal.

One embodiment includes a non-volatile storage apparatus, comprising: a set of non-volatile memory cells; and one or more control circuits in communication with the non-volatile memory cells. The one or more control circuits are configured to perform programming of data to the set of non-volatile memory cells until no more than a first number of programming errors exist and subsequently acknowledge that the programming of the data has completed. The one or more control circuits are configured to continue to perform programming of the data to the set of non-volatile memory cells until no more than a second number of programming errors exist after acknowledging that the programming of the data has completed. The second number is lower than the first number.

One embodiment includes an apparatus, comprising: a first communication interface configured to communicate with a host; a second communication interface configured to communicate with one or more non-volatile memory dies; and one or more processors in communication with the first communication interface and the second communication interface. The one or more processors are configured to instruct one or more non-volatile memory dies to perform a first phase of programming of data until no more than a first number of errors exist. The one or more processors are configured to read the data from the one or more non-volatile memory dies and correct error bits in the data read. The one or more processors are configured to instruct the one or more non-volatile memory dies to perform a second phase of programming of the data by programming the corrected error bits.

One embodiment includes a method of programming a non-volatile storage system, comprising: receiving first data from a host; programming the first data to a set of non-volatile memory cells using a set of verify references and a first bit ignore parameter as part of a first phase of programming the first data; identifying errors existing in storage of the first data in the set of non-volatile memory cells; and after identifying the errors and when the non-volatile storage system is idle, performing additional programming of the first data to the set of non-volatile memory cells in order to remedy the errors existing using the set of verify references and a second bit ignore parameter as part of a second phase of programming the first data, the second bit ignore parameter is lower than the first bit ignore parameter.

One embodiment includes a non-volatile storage apparatus, comprising: a monolithic three dimensional memory structure comprising non-volatile memory cells; means for programming data received from a host into a set of the non-volatile memory cells using a set of verify references and a first bit ignore parameter; means for reading the data from the set of non-volatile memory cells and identifying error bits in the data read using an error correction process; and means for programming the error bits into the set of the non-volatile memory cells using the set of verify references and a second bit ignore parameter while the non-volatile storage apparatus is idle, the second bit ignore parameter is lower than the first bit ignore parameter For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
    a set of non-volatile memory cells; and
    one or more control circuits in communication with the non-volatile memory cells, the one or more control circuits are configured to receive data from a host and perform partial programming of all the data to the set of non-volatile memory cells until no more than a first number of programming errors exist and subsequently report to the host that the programming of the data has successfully completed even though the one or more control circuits are configured to continue the programming of the data, the one or more control circuits are configured to continue to perform the programming of the data to the set of non-volatile memory cells until the one or more control circuits determine that no more than a second number of programming errors exist after reporting to the host that the programming of the data has successfully completed, the second number is lower than the first number.

2. A non-volatile storage apparatus according to claim 1, wherein:
    the one or more control circuits are configured to perform partial programming of the data to the set of non-volatile memory cells until no more than the first number of programming errors exist by programming the data to the set of non-volatile memory cells using a set of verify references; and
    the one or more control circuits are configured to continue to perform programming of the data to the set of non-volatile memory cells using the set of verify references.

3. A non-volatile storage apparatus according to claim 2, wherein:
    the one or more control circuits are configured to read the data from the set of non-volatile memory cells and identify error bits in the data read; and
    the one or more control circuits are configured to continue to perform the programming of the data to the set of non-volatile memory cells by programming the error bits into the set of the non-volatile memory cells.

4. A non-volatile storage apparatus according to claim 3, wherein:
    the one or more control circuits are configured to perform the programming of the error bits into the set of the non-volatile memory cells while the non-volatile storage apparatus is idle.

5. A non-volatile storage apparatus according to claim 1, wherein:
    the one or more control circuits are configured to read the data from the set of non-volatile memory cells and correct error bits in the data read; and the one or more control circuits are configured to continue to perform the programming of the data to the set of non-volatile memory cells by programming the corrected error bits into the set of the non-volatile memory cells.

6. A non-volatile storage apparatus according to claim 1, wherein:
the one or more control circuits are configured to continue to perform the programming of data to the set of non-volatile memory cells until no more than the second number of programming errors exist while the non-volatile storage apparatus is idle and after determining that the non-volatile storage apparatus is idle.

7. A non-volatile storage apparatus according to claim 1, wherein:
the one or more control circuits are configured to perform partial programming of data to the set of non-volatile memory cells by instructing one or more memory dies to program the data.

8. A non-volatile storage apparatus according to claim 1, wherein:
the reporting that the programming of the data has successfully completed includes any one of sending a message that programming has completed successfully, indicating that a different memory operation is being performed, or indicating availability for another operation.

9. A non-volatile storage apparatus according to claim 1, wherein:
the one or more control circuits are configured to read the data from the set of non-volatile memory cells after the partial programming of data to the set of non-volatile memory cells until no more than the first number of programming errors exist and prior to the continuing to perform the programming of the data to the set of non-volatile memory cells until no more than the second number of programming errors exist;
the one or more control circuits are configured to identify error bits in the data read by performing an error correction process that decodes code words and changes bits in the data read,
the bits changed are the error bits; and
the one or more control circuits are configured to continue to program the data to the set of non-volatile memory cells until no more than the second number of programming errors exist by programming the error bits into the set of the non-volatile memory cells.

10. A non-volatile storage apparatus according to claim 1, wherein:
the one or more control circuits are configured to perform programming of the data to the set of non-volatile memory cells until no more than the first number of programming errors exist by programming the data to an interim condition that is reflective of the data such that the data can be successfully read using an error correction process.

11. An apparatus, comprising:
a first communication interface configured to communicate with a host;
a second communication interface configured to communicate with one or more non-volatile memory dies; and
one or more processors in communication with the first communication interface and the second communication interface, the one or more processors are configured to receive data from the host to be programmed, the one or more processors are configured to instruct one or more non-volatile memory dies to perform a first phase of programming of all the data until no more than a first number of errors exist and then inform the host that the programming of the data has successfully completed even though the one or more processors are configured to continue the programming of the data, the one or more processors are configured to read the data from the one or more non-volatile memory dies and correct error bits in the data read, the one or more processors are configured to instruct the one or more non-volatile memory dies to perform a second phase of the programming of the data until no more than a second number of errors exist by programming the corrected error bits after the informing the host that the programming of the data has successfully completed, the second number is lower than the first number.

12. An apparatus according to claim 11, wherein:
the first phase of programming of the data and the second phase of programming of the data use the same verify references.

13. An apparatus according to claim 11, wherein:
the one or more processors are configured to instruct the one or more non-volatile memory dies to perform the second phase of programming of the data while the one or more non-volatile memory dies are idle.

14. A non-volatile storage apparatus, comprising:
a set of non-volatile memory cells; and
one or more control circuits in communication with the non-volatile memory cells and a host, the one or more control circuits are configured to receive data from the host, the one or more control circuits are configured to perform a first pass of programming of the data to the set of non-volatile memory cells until no more than a first number of programming errors exist such that the set of non-volatile memory cells are in an interim condition that is reflective of the data such that the data can be successfully read using an error correction process and subsequently report to the host that programming of the data has successfully completed, the one or more control circuits are configured to perform a second pass of programming of the data to the set of non-volatile memory cells from the interim condition to a target condition until no more than a second number of programming errors exist after reporting to the host that the programming of the data has successfully completed, the second number is lower than the first number.

15. A non-volatile storage apparatus according to claim 14, wherein:
the one or more control circuits are configured to read the data from the set of non-volatile memory cells after performing the first pass of programming and prior to performing the second pass of programming;
the one or more control circuits are configured to identify error bits in the data read by performing an error correction process that decodes code words and changes bits in the data read, the bits changed are the error bits; and
the one or more control circuits are configured to perform the second pass of programming of the data to the set of non-volatile memory cells by programming the error bits into the set of the non-volatile memory cells.

16. A non-volatile storage apparatus according to claim 14, wherein:
the one or more control circuits are configured to perform the second pass of programming of the data to the set of non-volatile memory cells while the non-volatile storage apparatus is idle and after determining that the non-volatile storage apparatus is idle;

the one or more control circuits are configured to perform the first pass of programming of the data to the set of non-volatile memory cells using a set of verify references; and the one or more control circuits are configured to perform the second pass of programming of the data to the set of non-volatile memory cells using the set of verify references.

17. A non-volatile storage apparatus according to claim 16, wherein:

the one or more control circuits are configured to perform the second pass of programming of the data to the set of non-volatile memory cells while the non-volatile storage apparatus is idle and after determining that the non-volatile storage apparatus is idle.

18. A non-volatile storage apparatus, comprising:

a set of non-volatile memory cells; and one or more control circuits in communication with the non-volatile memory cells and a host, the one or more control circuits are configured to receive data from the host, the one or more control circuits are configured to perform partial programming of the data to the set of non-volatile memory cells until no more than a first number of programming errors exist and subsequently report to the host that programming of the data has successfully completed, the one or more control circuits are configured to finish the programming of the data to the set of non-volatile memory cells after reporting to the host that the programming of the data has successfully completed and when the non-volatile storage apparatus is idle by performing additional programming of the data to the set of non-volatile memory cells until no more than a second number of programming errors exist, the second number is less than the first number.

19. A non-volatile storage apparatus according to claim 18, wherein:

the one or more control circuits are configured to perform partial programming of the data to the set of non-volatile memory cells until no more than the first number of programming errors exist and subsequently report to the host that programming of the data has successfully completed even though the one or more control circuits are configured to continue the programming of the data.

20. A non-volatile storage apparatus according to claim 18, wherein:

the one or more control circuits are configured to read the data from the set of non-volatile memory cells after the partial programming of data to the set of non-volatile memory cells until no more than the first number of programming errors exist and prior to finishing the programming of the data to the set of non-volatile memory cells;

the one or more control circuits are configured to identify error bits in the data read by performing an error correction process that decodes code words and changes bits in the data read, the bits changed are the error bits; and the one or more control circuits are configured to finish the programming of the data to the set of non-volatile memory cells by programming the error bits into the set of the non-volatile memory cells.

* * * * *